United States Patent [19]
Gorczyca et al.

[11] Patent Number: 5,285,571
[45] Date of Patent: Feb. 15, 1994

[54] METHOD FOR EXTENDING AN ELECTRICAL CONDUCTOR OVER AN EDGE OF AN HDI SUBSTRATE

[75] Inventors: Thomas B. Gorczyca; Paul A. McConnelee; Richard J. Saia, all of Schenectady, N.Y.

[73] Assignee: General Electric Company, Schenectady, N.Y.

[21] Appl. No.: 959,886

[22] Filed: Oct. 13, 1992

[51] Int. Cl.$^5$ .......................... H05K 3/24; H05K 3/28
[52] U.S. Cl. .......................................... 29/848; 29/834
[58] Field of Search ................. 29/847, 848, 850, 865, 29/866, 867, 834, 836; 156/630, 647, 659; 439/406, 407, 610; 361/414

[56] References Cited

U.S. PATENT DOCUMENTS

| | | | |
|---|---|---|---|
| 3,659,160 | 4/1972 | Sloan, Jr. et al. | 156/647 X |
| 3,675,319 | 7/1972 | Smith | 156/647 X |
| 4,200,969 | 5/1980 | Aoyama et al. | 29/847 X |
| 4,283,485 | 8/1981 | Müenz et al. | 29/847 X |
| 4,783,695 | 11/1988 | Eichelberger et al. | 357/65 |
| 4,835,704 | 5/1989 | Eichelberger et al. | 364/490 |
| 4,878,991 | 11/1989 | Eichelberger et al. | 156/630 |
| 4,933,042 | 6/1990 | Eichelberger et al. | 156/239 |
| 5,002,367 | 3/1991 | Nicholas | 29/847 X |
| 5,019,946 | 5/1991 | Eichelberger et al. | 361/414 |
| 5,161,093 | 11/1992 | Gorczyca et al. | 361/414 |
| 5,190,473 | 3/1993 | Mroczkowski et al. | 439/610 X |

*Primary Examiner*—Peter Dungba Vo
*Attorney, Agent, or Firm*—Geoffrey H. Krauss; Ann M. Kratz; Marvin Snyder

[57] ABSTRACT

A process and configuration are described which enable the I/O metal fingers of any high density interconnect (HDI) module to be extended over the edge of a substrate at the end of circuit fabrication, thus enabling fabrication of circuits for arrangement in three-dimensional stacks. The module includes a first dielectric layer covering one or more electrical conductors on a substrate. The first dielectric layer is ablated to expose a portion of at least one electrical conductor and a second dielectric layer is then applied over the first dielectric layer and the exposed portion of the electrical conductor except for an extremity of the conductor. A second electrical conductor is subsequently applied and patterned to cover a portion of the second dielectric layer, the extremity of the conductor, and at least a portion of one edge of the substrate.

10 Claims, 8 Drawing Sheets

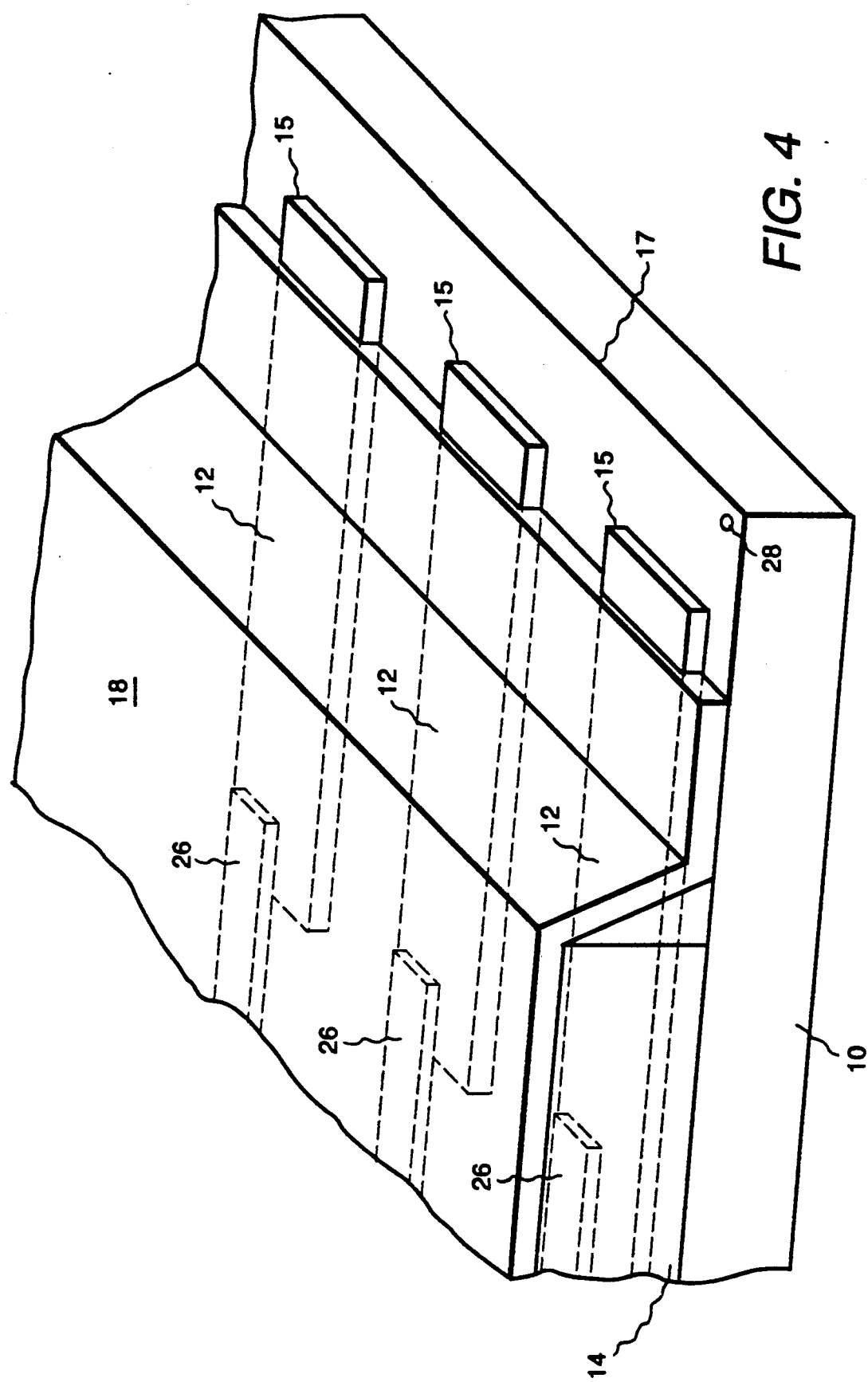

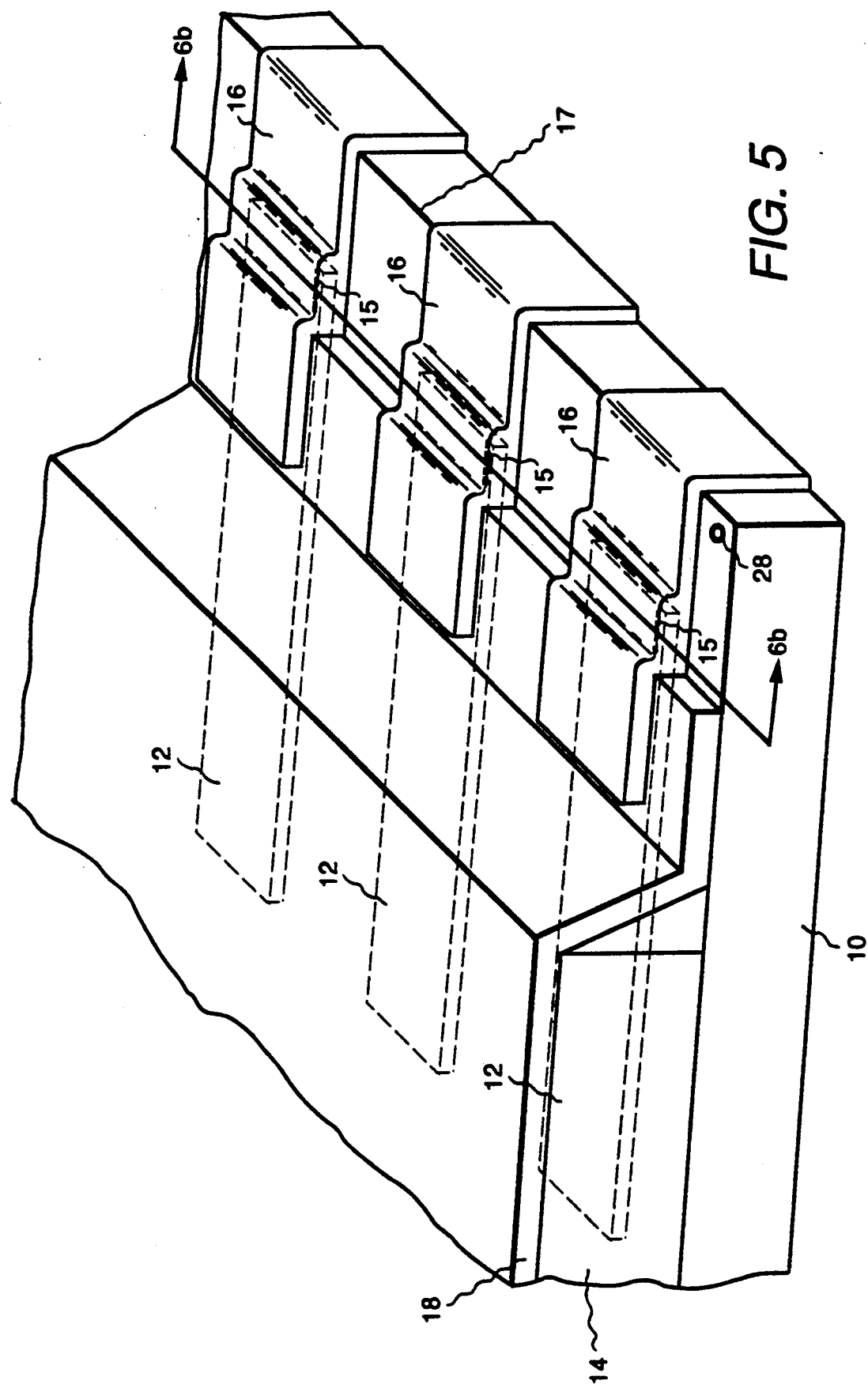

METHOD FOR EXTENDING AN ELECTRICAL CONDUCTOR OVER AN EDGE OF AN HDI SUBSTRATE

The invention was made with Government support under contract No. F29601-89-C-0014 awarded by the Air Force. The Government has certain rights in the invention.

CROSS REFERENCE TO RELATED APPLICATION

This application is related to the following co-pending application which is assigned to a common assignee and is incorporated herein by reference: "Method and Apparatus for Fabricating a Metal Interconnection Pattern for an Integrated Circuit Module", Ser. No. 07/959,883, filed Oct. 13, 1992 by E. W. Balch et al., filed concurrently herewith.

BACKGROUND OF THE INVENTION

1. Field of the Invention

This invention is generally related to a method for interconnecting integrated circuits with high volumetric efficiency and, more particularly, to a method of applying edge metallization for use in a three-dimensional module.

2. Description of the Related Art

Interconnecting high performance circuits, such as very large scale integrated circuit (VLSI) chips, presents the circuit designer with several problems. VLSI chips often have one hundred or more pins, each with a pitch of less than ten mils. That is to say, the sum of the conductor line width plus the distance between two adjacent lines is less than ten thousandths of an inch. The VLSI chips typically must be joined to a printed circuit board which has a pitch of twenty-five to fifty mils. In order to connect a VLSI chip to the circuit board, a "fan out" region of interconnecting lines must be provided. The fan out region occupies valuable space on the circuit board, and the long lead lengths contribute high inductance. Thus, the fan out design limits the high speed capability of the circuit. In multi-chip substrates, which are comprised of numerous chips mounted on the same substrate, interconnections among chips on the substrate allow high speed performance, but substantial performance loss occurs in going from the substrate to the printed circuit board. Not only is soldering several hundred pins on twenty-five mil centers a very difficult task, but in addition, thermal mismatches and hermeticity requirements affect the size of substrate which can be created practically. According to Rent's rule, the number of pins required increases in accordance with the square root of the number of gates enclosed by the circuitry. Since each pin must be hermetically sealed, the advantage of multi-chip substrates is severely limited by the unavailability of hermetic packages which can seal more than about three hundred pins.

A method of selectively interconnecting the edge contact areas of a plurality of tightly stacked substrates having integrated circuit patterns thereon is described in commonly assigned U.S. Pat. No. 5,019,946, issued May 28, 1991, which is herein incorporated by reference. Fabrication of high density interconnect (HDI) circuits for three-dimensional module formation requires the I/O (i.e., input/output) metal fingers (i.e., metallization exposed to areas outside the integrated circuit) to be extended over the edges of the substrate. Extending titanium/aluminum I/O metal fingers over the substrate edges during I/O metal patterning prior to circuit fabrication is difficult since these are sputter deposited films and thickness conformity over an edge is forty percent at best. Even if it were possible to reliably use Ti/Al, it would be difficult to protect the metal during subsequent processing because the I/O metal on the substrate edge, unlike the I/O metal on the top, is exposed. As a result, aluminum and titanium would be exposed to all wet chemical treatments normally seen during circuit fabrication. These metals are not compatible with many chemicals and would be etched away.

The use of alternate metals compatible with the wet chemical process, such as chromium/gold or TiW/gold is feasible if the gold layer is electroplated to obtain good step coverage over the edge. These metal combinations, however, are not desirable for applications in which the circuit is exposed to x-rays. Chromium/copper lines capped with electrolessly plated nickel and thinner gold might also be feasible, but the nickel and gold layers must be pinhole free. Any exposed edge metal would require isolation during sputtering steps. Additionally, current conduction from the topside metal through the vias and I/O metal fingers may cause via damage and/or copper plating on the fingers and substrate backside, shorting them together.

Finally, any scheme which places the I/O metal over the substrate edges at the beginning of the process would suffer from the possibility of being mechanically damaged during subsequent processing. Cleaning residual polymers off of the metallized substrate edges after many spray and spin coating steps during the entire process is also not trivial.

SUMMARY OF THE INVENTION

One object of this invention is to provide a method of fabrication of circuits to be used in three-dimensional devices which requires only conventional processing of circuits, using titanium/aluminum for I/O metal.

Another object of this invention is to provide a variety of metallization schemes for fabricating the I/O metal fingers of three-dimensional HDI circuits, depending on requirements.

Briefly, in accordance with a preferred embodiment of the invention, a method is provided for extending an electrical conductor over an edge of a substrate. The conductor is situated in a first dielectric layer on the substrate and is conductively coupled to an integrated circuit situated on one portion of the substrate. The first dielectric layer is ablated on a second portion of the substrate to expose a portion of the electrical conductor. A second dielectric layer is applied over the first dielectric layer and over the second portion of the substrate and including the exposed portion of the electrical conductor, except for a region extending from one edge of the substrate onto an extremity of the conductor. An electrical conducting extension means is applied and patterned to cover a portion of the second dielectric layer, the extremity of the electrical conductor, and at least a portion of the edge of the substrate.

In another preferred embodiment, another method is provided for extending an electrical conductor over an edge of a substrate. The conductor is situated in a first dielectric layer on the substrate and is conductively coupled to an integrated circuit situated on one portion of the substrate. The first dielectric layer is ablated on a second portion of the substrate to expose an extremity of the electrical conductor. An electrical conducting extension means is applied and patterned to cover a portion of the first dielectric layer, the extremity of the electrical conductor, and at least a portion of the edge of the substrate.

In another preferred embodiment, an apparatus including a substrate is provided. An electrical conductor is located on the substrate. The electrical conductor is conductively coupled to an integrated circuit situated on one portion of the substrate. A dielectric layer covers a portion of the electrical conductor. An electrical conducting extension means covers a portion of the dielectric layer, the exposed portion of the electrical conductor, and at least a portion of one edge of the substrate.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings, with like numerals throughout the drawings representing like components throughout the drawings, in which:

FIG. 4 is a perspective view of an HDI assembly after a second ablation of the second dielectric layer over the extremities of the I/O metal fingers;

FIG. 5 is a perspective view of I/O metal finger extensions showing the coverage over the second dielectric layer, the I/O metal fingers, and the edge of the substrate;

DETAILED DESCRIPTION OF THE PREFERRED EMBODIMENTS OF THE INVENTION

Figure 1:
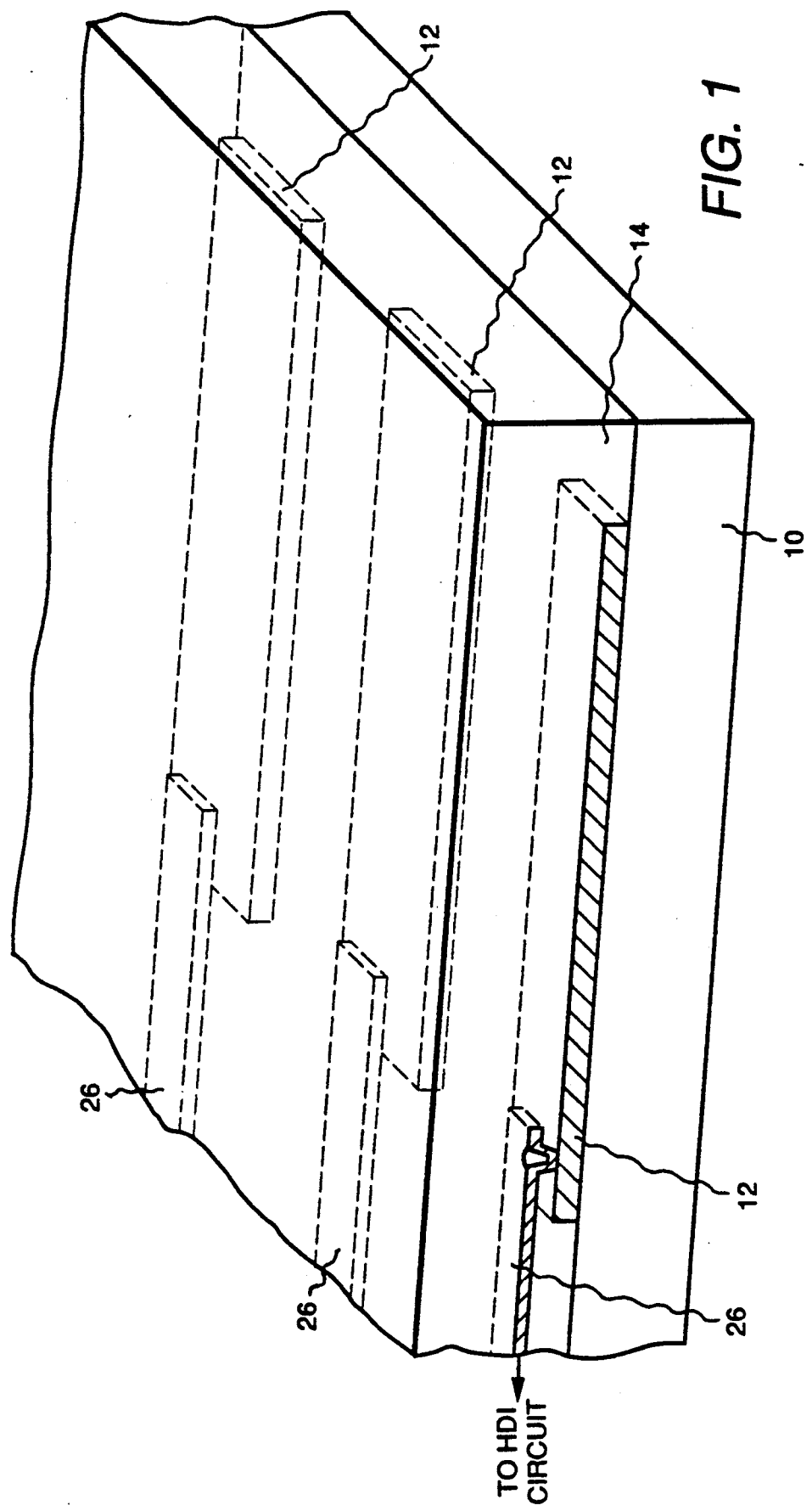
FIG. 1 is a perspective view of an HDI assembly having a dielectric layer over I/O metal fingers.

FIG. 1 illustrates a dielectric substrate 10, preferably ceramic, having a plurality of I/O metal fingers 12 covered by a dielectric layer 14. Dielectric layer 14 is preferably a polymer and likely to comprise multiple layers of polymers. I/O metal finger 12 is located on the substrate and connected to the "metal-1" layer 26, which is the first interconnect metallization layer of an HDI circuit (not shown). Preferably I/O metal finger 12 comprises a very thin layer of titanium (for adhesion) on the substrate surface with a much thicker layer of aluminum on top. Both the I/O metal finger 12 and the HDI circuit, which is located on a portion of substrate 10 not shown in FIG. 1, are fabricated in conventional fashion, except for possible modification of the I/O metal finger length. The basic HDI fabrication method is disclosed, for example, in commonly assigned U.S. Pat. No. 4,783,695, issued Nov. 8, 1988, which is herein incorporated by reference.

Figure 2:
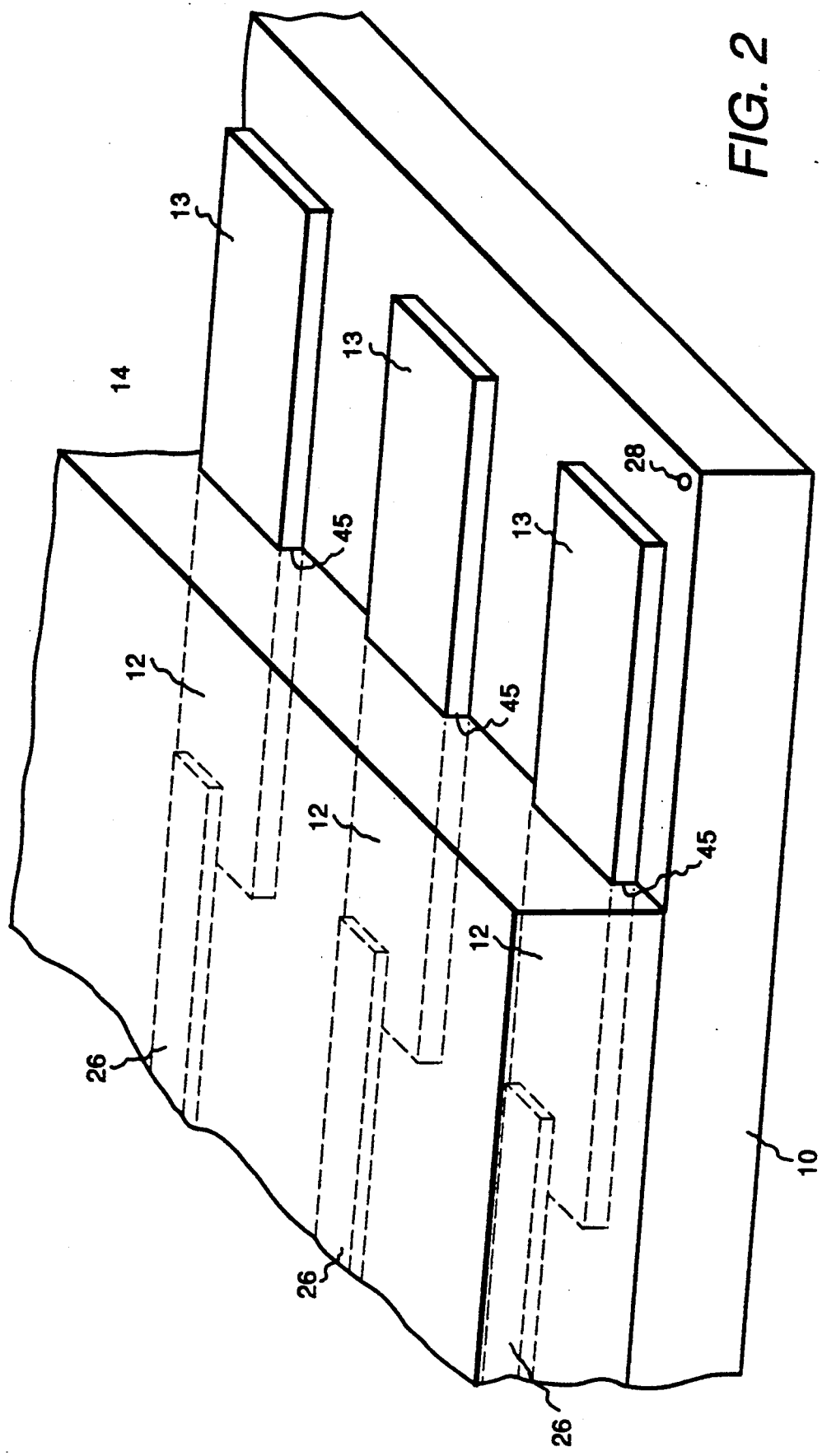
FIG. 2 is a perspective view of an HDI assembly after ablation of a dielectric layer over a portion of the I/O metal fingers.

FIG. 2 illustrates the metal fingers after dielectric layer 14 has been ablated, in a first polymer ablation step, over a portion of the I/O metal fingers. The dielectric layer 14 is ablated, following HDI circuit fabrication, to expose tips 13 of I/O metal fingers 12. The currently preferred method of ablation is by use of an excimer laser. This involves exposing the area of dielectric to be ablated to a series of laser pulses, with each pulse ablating part of the dielectric thickness until the dielectric is totally ablated. A simple way of limiting ablation to a desired area is to use a metal shield. Preferably, the length of an entire I/O metal finger, as measured from the interconnect with metal-1 layer 26 at the end of the layer is 2000 μm, and the length of the I/O metal finger tip that is exposed after ablation is 1400 μm. After ablation, the circuit may be tested for nominal operation. Milled fiducial 28 is an optional feature which acts as a reference point and may be used for patterning I/O metal fingers 12 during the fabrication step discussed with respect to FIG. 1, as well as for patterning I/O metal finger extensions 16 as discussed with respect to FIG. 5.

Figure 3:
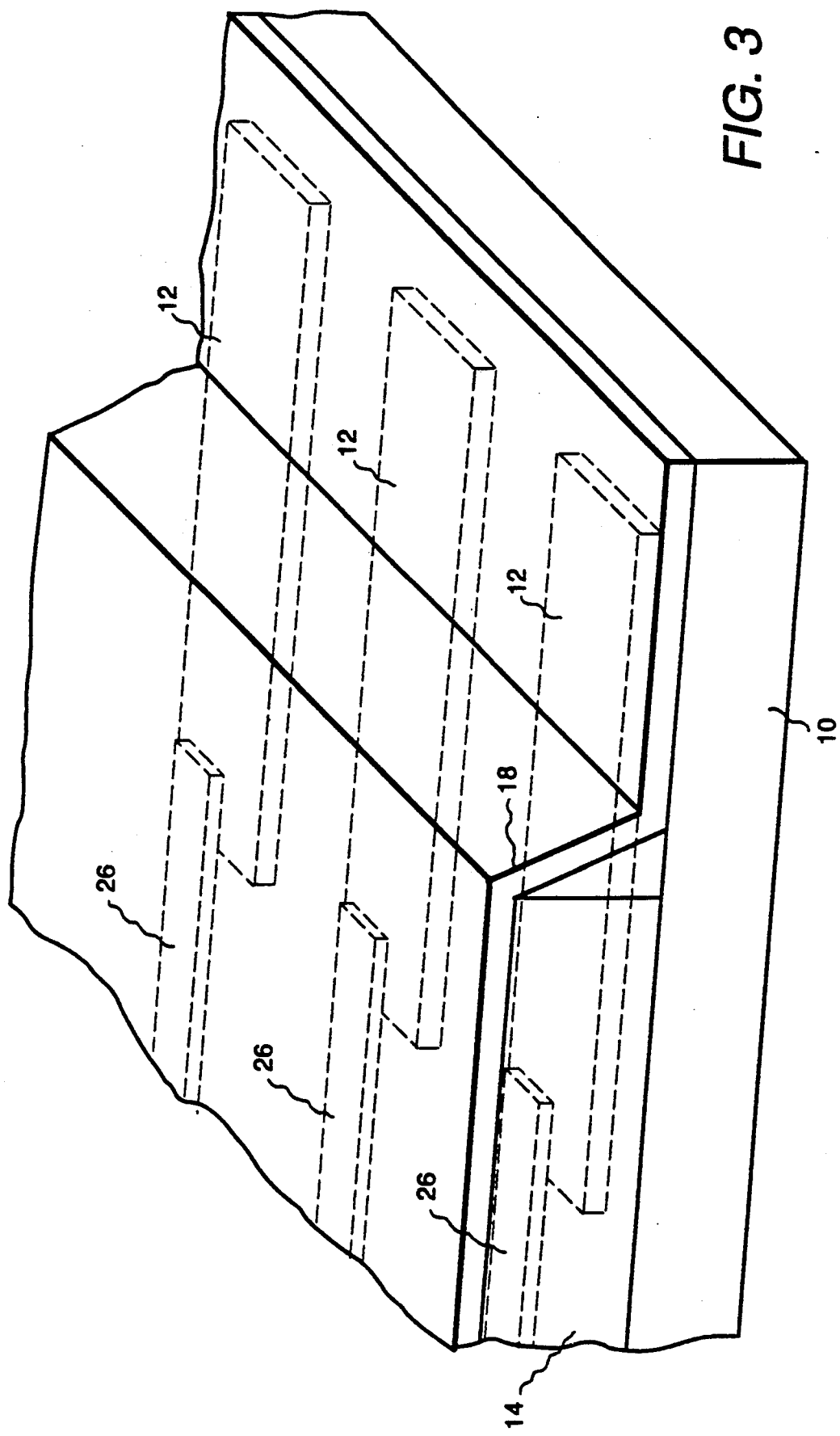
FIG. 3 is a perspective view of an HDI assembly after applying a second dielectric layer over the I/O metal fingers.

FIG. 3 illustrates a preferred embodiment of the invention, which involves extending the I/O metal finger by first applying a second dielectric layer 18 over the ablated first dielectric layer 14 and I/O metal finger 12. The second dielectric layer may be applied in any appropriate manner and preferably by using the SPI(silicon polyimide)/epoxy-Kapton polyimide multi-lamination process described in allowed U.S. application Ser. No. 07/546,959, filed Jul. 2, 1990, entitled "Multiple Lamination High Density Interconnect Process and Structure Employing a Variable Crosslinking Adhesive", which is commonly assigned and herein incorporated by reference. (Kapton is a trademark of E.I. duPont de Nemours and Co.). This second dielectric layer completely seals the metal-first dielectric interface formed by the first dielectric ablation step, preventing attack of the I/O metal fingers at that interface 45 (shown in FIG. 2) during subsequent wet chemical treatments. Dielectric layer 18 also allows a smooth transition from the substrate surface to the outermost surface of the dielectric layer, resulting in excellent metal sputter coverage and resulting trouble-free metal electroplating. Other lamination methods are disclosed in U.S. Pat. No. 4,783,695, issued Nov. 8, 1988, and U.S. Pat. No. 4,933,042, issued Jun. 12, 1990, both of which are commonly assigned and herein incorporated by reference.

FIG. 4 illustrates the HDI assembly after an ablation of the second dielectric layer 18 over the extremities 15 of I/O metal fingers 12. The ablation may be performed in the same manner as discussed with reference to FIG. 2. Residual polymer on ceramic edges may be cleaned by laser ablation and by plasma cleaning using a $CF_4/O_2$ gas mixture. Preferably, the length of extremity 15 as measured from the end of dielectric layer 18 is about 400 μm.

The invention, however, is not limited to the situation wherein a second dielectric layer is applied and then ablated in a separate step. What is important is that the end result, as shown in FIG. 4, is that second dielectric layer 18 is applied over a portion of substrate 10 and I/O metal fingers 12, except for a region extending from the substrate edge 17 onto an extremity 15 of an I/O metal finger 12, and thus leaves at least one extremity 15 exposed.

The substrate 10 edge 17 over which I/O metal fingers will be extended may be tapered slightly (not shown) by any appropriate method. For example, one method is to polish the edge with 600 grit wet/dry sandpaper, followed by a high pressure water scrub. This optional tapering will improve the results of subsequent sputtering and electroplating techniques.

Figure 6A:
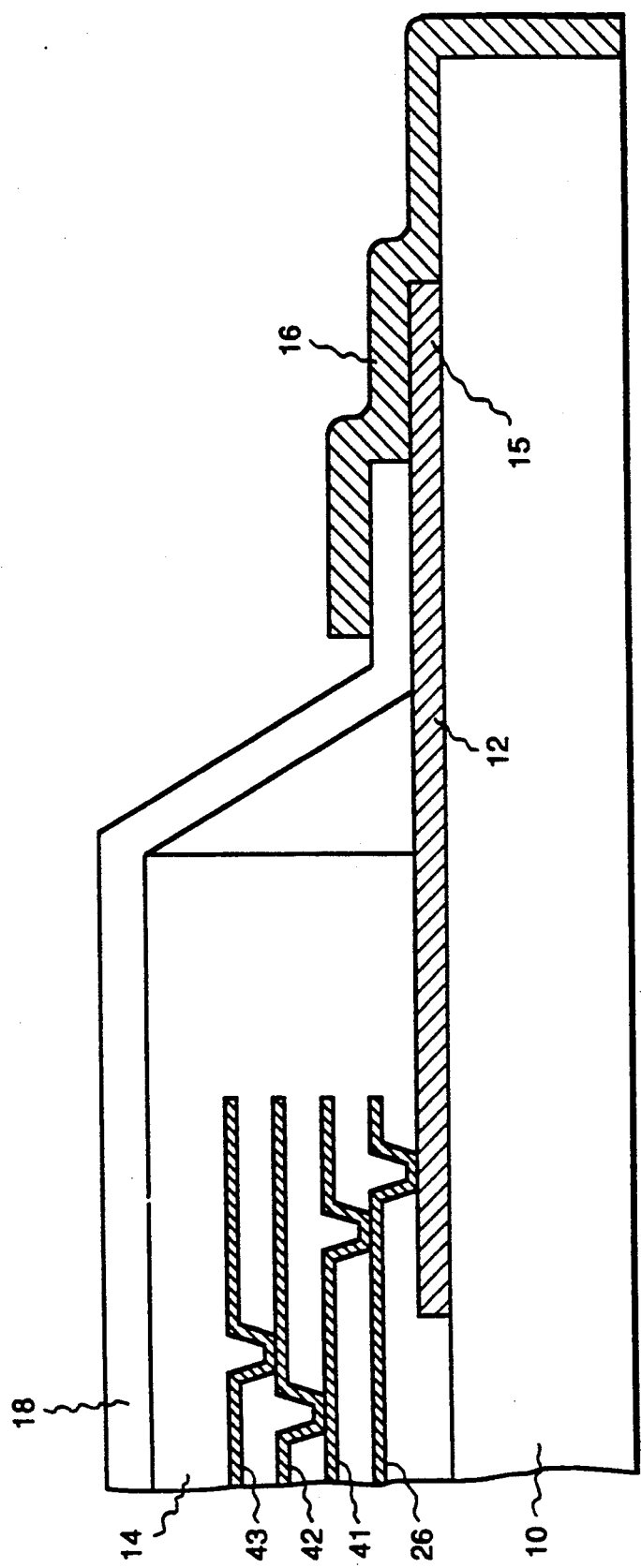
FIG. 6a is a sectional side view of the completed I/O metal finger extensions showing the recommended design.
Figure 6B:
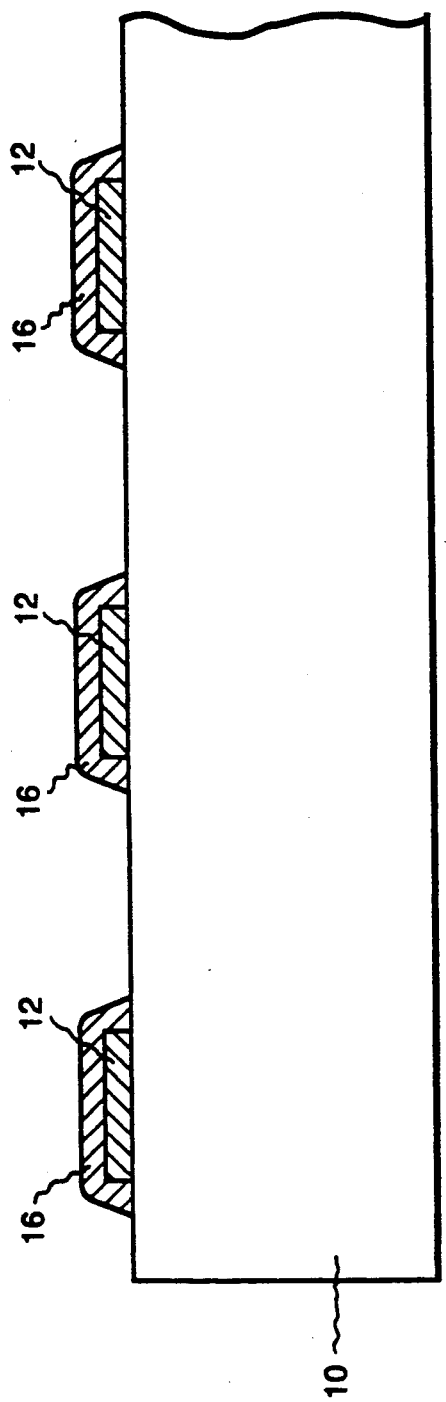
FIG. 6b is a sectional front view of I/O metal finger extensions covering I/O metal fingers.

FIG. 5 is a perspective view illustrating an I/O metal finger extension 16 showing its coverage over the second dielectric layer 18, I/O metal finger extremities 15, and the edge of substrate 10. FIG. 6a is a schematic side view of the completed edge metal showing the preferred design. Metal layers 26, 41, 42, and 43 are interconnect metallization layers of an HDI circuit (not shown). FIG. 6b is a sectional front view of metal finger extensions 16 covering metal fingers 12. The substrate may be metallized using standard metal sputter and electroplating techniques, coated electrophoretically with photo resist and patterned with artwork which overlays the exposed I/O metal finger 12 and part of the multi-laminated dielectric layer 18. A suggested combination of metallization is sputtering of 0.2 μm titanium followed by 0.6 μm copper, electroplating 4 μm copper and capping by sputtering 0.1 μm titanium.

More specifically, a photo resist may be applied electrophoretically and exposed using an argon ion laser system, preferably of the type described in commonly assigned U.S. Pat. No. 4,835,704, issued May 30, 1989, which is herein incorporated by reference, with appropriate modifications for exposing over the substrate edges. Several efficient, alternative approaches for exposing resist over the substrate edges are disclosed in the aforementioned co-pending U.S. application Ser. No. 07/959,883: using plane mirrors at forty-five degree angles to cause the metal pattern to be inverted on the substrate; and using a quartz penta prism which deviates the optical axis through ninety degrees without inverting the image. The resist may be developed and the metal etched using conventional processing techniques. Any conductive background remaining on dielectric 18 may be removed using reactive ion etching with a carbon tetrafluoride and argon gas mixture.

Alignment for resist patterning is easily accomplished by using any milled fiducials 28 on the substrate which were exposed during the polymer ablation steps. The fiducials may be milled at the same time any pockets for chips (not pictured) are milled. These fiducials may also be used for patterning the I/O metal fingers, thus enabling excellent alignment between the metal patterns. Metal and resist coverage over the ablated dielectric edge is nearly conformal. Following conventional metal etch and resist stripping, I/O metal finger extension 16 stands completed.

I/O metal finger extension 16 makes contact to I/O metal finger 12 over substrate 10 and continues to extend only over the substrate to the substrate edge 17, providing an extremely reliable bond. Extension 16 also overlaps second dielectric layer 18 to protect I/O metal finger 12 from attack during etching. Any electrical conductor may be used for extending the fingers, provided it is compatible with HDI processing and makes good contact to the I/O metal. The I/O metal finger extension 16 is drawn in FIG. 5 and FIG. 6b as having curved surfaces because the metallization was applied over a surface which was not flat.

The titanium/copper/titanium edge metal suggested above may be reworked with no detrimental effect to the HDI circuit. Rework may be accomplished by wet etching the top titanium layer in a dilute hydrofluoric acid solution followed by a nitric acid dip to etch the underlying copper. The bottom titanium layer may be etched using reactive ion etching with a carbon tetrafluoride and argon gas mixture, leaving an exposed aluminum I/O metal finger 12 completely intact and dielectric layer 18 conditioned for accepting the next processing step. If the entire circuit needs rework, the edge metal can be removed and the dielectric layer or layers may be removed and reworked in conventional HDI fashion as disclosed in commonly assigned U.S. Pat. No. 4,878,991, issued Nov. 7, 1989, which is herein incorporated by reference. After rework, the edge metal can be reapplied by performing the above discussed steps for applying edge metal.

Another embodiment provides an alternative method of practicing the invention to achieve similar results by using a single ablation. However, by progressing directly from the configuration of FIG. 2 to the metallization of the I/O metal finger extensions discussed with respect to FIG. 5, the thickness of dielectric layer 14 does not allow for a smooth transition and causes metal sputtering and electrical plating to be more difficult. One method for avoiding this problem would be to taper the edge of dielectric layer 14. A tapered edge for dielectric 14 can be obtained, for example, by changing the laser beam angle of incidence at the substrate, facilitating a smooth transition from the outermost dielectric surface to the substrate and thereby allowing good metallization coverage.

Figure 7:
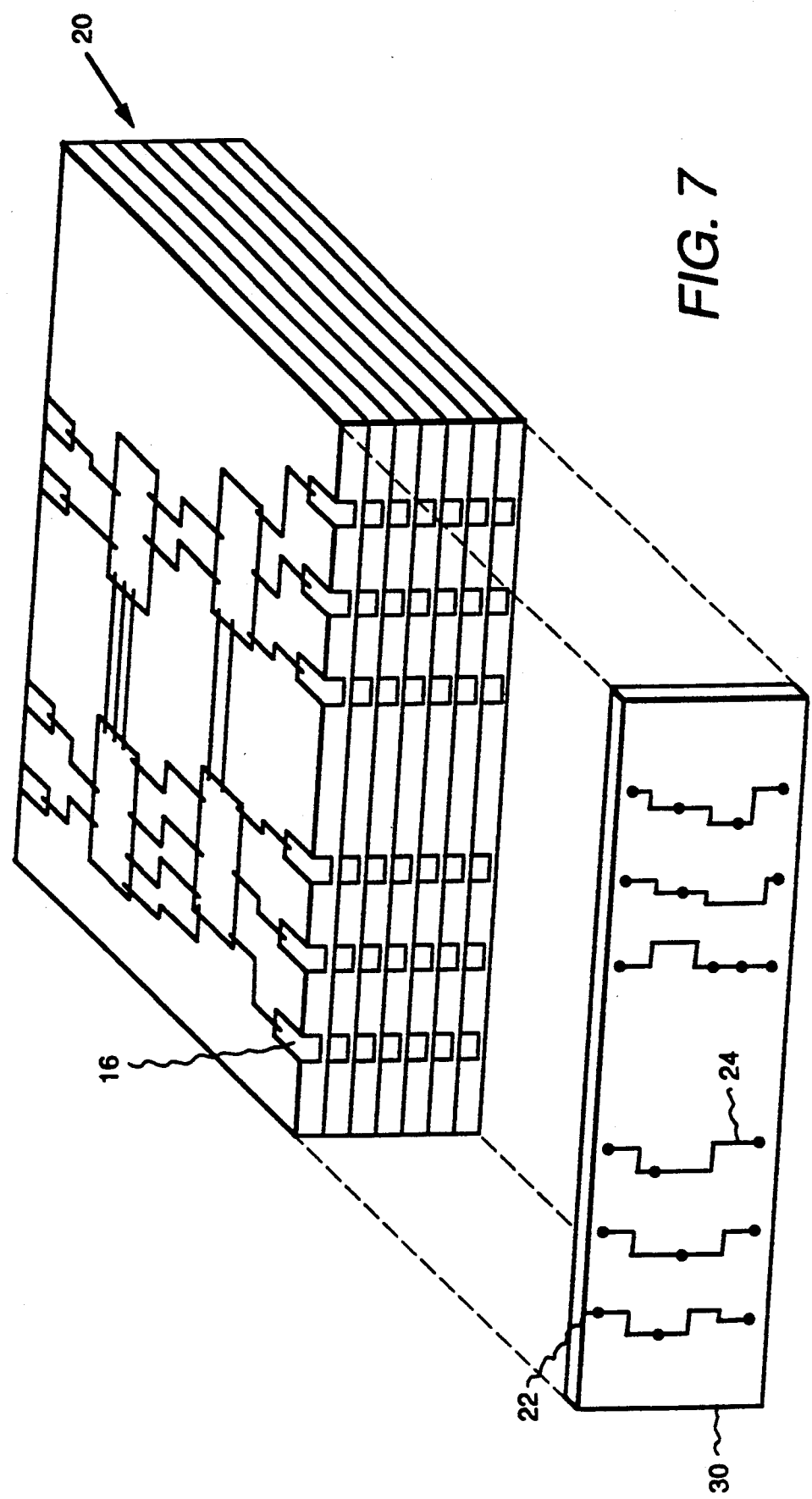
FIG. 7 is a perspective view of a stack of the HDI assemblies.

FIG. 7 is a perspective view of a stack 20 of finished modules. After a circuit has the completed I/O metal finger extensions added, it may be mounted into three-dimensional stack 20. Any of the stack edges that I/O metal fingers 16 extend over must be laminated with dielectric layer 30. After laminating, vias 22 are formed, preferably by laser ablation of the laminated dielectric, to expose the I/O metal finger extensions 16. Finally, the stacked modules are interconnected by a pattern of electrical conductors 24 extending between selected ones of vias 22. This may be accomplished by coating metal over laminated dielectric layer 30 using sputtering and electroplating techniques, applying resist, and patterning, preferably with the adaptive lithography system, followed by etching.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for extending an electrical conductor over an edge of a substrate, the conductor being situated within a first dielectric layer previously fabricated on a surface of the substrate and being conductively coupled to an integrated circuit situated on one portion of the substrate surface, comprising the steps of:

ablating a part of the existing first dielectric layer on a second portion of the substrate, devoid of any integrated circuit, to expose a portion of the electrical conductor situated in the second substrate portion;

applying a second dielectric layer over at least a part of the first dielectric layer and over the second substrate portion and including the exposed electrical conductor portion, with the second dielectric layer not being applied to a region extending from an edge of the substrate onto an adjacent electrical conductor extremity portion, said edge disposed at an angle to the substrate surface; and applying an electric-conducting extension means patterned to cover a portion of the second dielectric layer, a part of the electrical conductor extremity portion, and at least a portion of the angularly-disposed substrate edge.

2. The method of claim 1, wherein the second dielectric layer is applied by the SPI/epoxy-Kapton polyimide multi-lamination process.

3. The method of claim 1, further including the step of tapering the substrate edge.

4. The method of claim 1, further including the steps of: removing the electrical-conducting extension means in order to allow for rework; and reapplying a desired electrical-conducting extension means patterned to cover, after rework, a portion of the second dielectric layer, the electrically-conducting extremity, and at least a portion of the substrate edge.

5. A method for extending an electrical conductor over an edge of a substrate, the conductor being situated within a first dielectric layer previously fabricated on a surface of the substrate and being conductively coupled to an integrated circuit situated on one portion of the substrate surface, comprising the steps of:

ablating a part of the existing first dielectric layer on a second portion of the substrate, devoid of any integrated circuit and adjacent to the substrate edge, to expose an extremity portion of the electrical conductor adjacent to an edge of the substrate, said edge disposed at an angle to the substrate surface; and applying an electric-conducting extension means patterned to cover a portion of the first dielectric layer, a part of the electrical conductor extremity portion, and at least a portion of the angularly-disposed substrate edge.

6. The method of claim 5, wherein the step of ablating is performed so as to taper part of the first dielectric layer between an outermost surface of the fist dielectric layer and the substrate.

7. The method of claim 5, further including the steps of: removing the electrically-conducting extension means in order to allow for rework; and reapplying a desired electrical-conducting extension means patterned to cover, after rework, a portion of the first dielectric layer, the electrically-conducting extremity, and at least a portion of the substrate edge.

8. The method of claim 5, further including the step of tapering the edge of the substrate.

9. A method for extending an electrical conductor over an edge of an HDI ceramic substrate, the conductor being situated within a first dielectric layer previously fabricated on a surface of the substrate and being conductively coupled to an HDI circuit situated on one portion of the substrate surface, comprising the steps of:

ablating a part of the existing first dielectric layer on a second portion of the substrate, devoid of any integrated circuit, to expose a portion of the electrical conductor situated in the second substrate portion;

applying a second dielectric layer over at least a part of the first dielectric layer and over the second substrate portion and including the exposed electrical conductor portion, with the second dielectric layer not being applied to a region extending from an edge of the substrate onto an adjacent electrical conductor extremity portion; and applying and electric-conducting extension means patterned to cover a portion of the second dielectric layer, a part of the electrical conductor extremity portion, and at least a portion of the substrate edge disposed at an angle to the substrate surface.

10. The method of claim 9, wherein the second dielectric layer is applied by the SPI/epoxy-Kapton polyimide multi-lamination process.

* * * * *